United States Patent [19]

De La Moneda et al.

[11] 4,072,868
[45] Feb. 7, 1978

[54] FET INVERTER WITH ISOLATED SUBSTRATE LOAD

[75] Inventors: Francisco H. De La Moneda, Reston; Harish N. Kotecha, Manassas, both of Va.

[73] Assignee: International Business Machines Corporation, Armonk, N.Y.

[21] Appl. No.: 723,678

[22] Filed: Sept. 16, 1976

[51] Int. Cl.² ............... H03K 19/08; H03K 19/40; H01L 27/08; H01L 29/78
[52] U.S. Cl. ............................ 307/214; 307/205; 307/213; 307/304; 357/23; 357/41; 357/42
[58] Field of Search ............... 307/205, 213, 214, 279, 307/304; 357/23, 41, 42

[56] References Cited

U.S. PATENT DOCUMENTS

| 3,436,621 | 4/1969 | Crawford | 357/41 |
|---|---|---|---|
| 3,461,361 | 8/1969 | Delivorias | 357/42 |
| 3,585,463 | 6/1971 | Richman | 357/42 |
| 3,700,981 | 10/1972 | Masuhara et al. | 307/205 X |
| 3,766,637 | 10/1973 | Norris et al. | 357/42 X |
| 3,775,693 | 11/1973 | Proebsting | 307/214 X |
| 3,865,649 | 2/1975 | Beasom | 357/42 X |
| 3,916,430 | 10/1975 | Heuner et al. | 307/304 X |
| 3,920,481 | 11/1975 | Hu | 357/42 X |
| 3,925,120 | 12/1975 | Saida et al. | 357/42 X |
| 3,980,896 | 9/1976 | Kato | 307/205 |
| 3,983,572 | 9/1976 | Johnson | 357/42 X |

OTHER PUBLICATIONS

Anantha, "Simultaneously Forming Memory & Support Circuits Using FETS"; IBM Tech. Discl., Bull.; vol. 16, No. 49, 1973; pp. 1037-1038.

Lehman et al., "Formation of Depletion & Enhancement Mode FETS"; IBM Tech. Discl., Bull.; vol. 8, No. 4, 9/1965; pp. 675-676.

Forbes, "Circuit Having Depletion Mode & Enhancement Mode FETs on a Single Chip"; IBM Tech. Discl. Bull.; vol. 15, No. 4, p. 1143; 9/1972.

Primary Examiner—Larry N. Anagnos
Attorney, Agent, or Firm—John E. Hoel

[57] ABSTRACT

An insulated Gate Field Effect Transistor (IGFET) static inverter having an improved load line characteristic is disclosed. The inverter comprises an enhancement mode IGFET active device in a first portion of a semiconductor substrate, having its drain connected to an output node, its source connected to a source potential and its gate connected to an input signal source. The first portion of the substrate is connected to a first substrate potential. A depletion mode IGFET load device is located in a second portion of the semiconductor substrate which is electrically isolated from the first portion. The depletion mode load device has its drain connected to a drain potential and its source, gate and the second portion of the semiconductor substrate all connected to the output node. In this manner, the rise in the source-to-substrate voltage bias during the turn-off transition is eliminated in the depletion mode load device, providing an improved load current characteristic for the inverter. Alternate embodiments are disclosed directed to an all N-channel inverter, an all P-channel inverter, and a complementary inverter consisting of a P-channel load device and an N-channel active device.

6 Claims, 12 Drawing Figures

FET INVERTER WITH ISOLATED SUBSTRATE LOAD

FIELD OF THE INVENTION

The invention disclosed is directed to monolithic IGFET circuits and more particularly to IGFET signal inverter circuits.

BACKGROUND OF THE INVENTION

One of the major disadvantages associated with IGFET inverter circuits has been their relatively poor current driving capability. The IGFET device is a modulated resistor and consequently IGFET circuits exhibit large RC time constants, particularly during their turn-off transition when driving capacitive loads. This deficiency becomes substantial when the IGFET inverter is used as an off-chip driver for a large scale integrated circuit, charging second-level package capacitances. Several IGFET inverter circuits are available from the prior art. They are briefly reviewed in what follows.

The simplest IGFET inverter circuit consists of a resistor connected in series with an enhancement mode IGFET. The circuit is completed by connecting the source of the IGFET to a reference or ground potential and the resistor to a drain voltage supply. The output voltage of this circuit is taken at the interconnection node betwen resistor and IGFET. When the enhancement mode transistor is in its off state, the output is at the drain voltage supply which is typically referred to as the logic "one" level. When the enhancement mode IGFET is switched on, the output is pulled down (N-channel) to a level near the reference voltage, which is typically referred to as the logic "zero" level. The logic "zero" level depends on the ratio between the resistance of the enhancement mode IGFET and the load resistor. Although the use of a simple resistor for load has the advantage that one of the output levels is the voltage of the drain supply, the circuit is not practical in integrated circuit form because a diffused region on the chip having resistance sufficiently large to provide a low level of power dissipation, occupies a large surface area.

One substitute for a diffused load resistor is an enhancement mode IGFET, whose gate and drain terminals are connected to the drain voltage supply. However, this circuit has the disadvantage that the logic "one" level of the output can only reach a potential equal to the drain voltage less one threshold voltage of the load IGFET, which is typically greater than one volt. Another disadvantage is that the output current of the load device decreases very rapidly as the magnitude of the output node voltage, which is also the potential of the source terminal of the load IGFET, increases because the load transistor is always biased in its saturated range. This type of inverter circuit is referred to as saturated load.

Another implementation of a load device for an IGFET inverter circuit uses an enhancement mode IGFET, whose gate is connected to a gate voltage supply having a greater magnitude than the drain voltage supply. With this type of voltage bias, the load device is always biased in its linear range and the undesirable drop in load current found in saturated loads is eliminated. Accordingly, this type of inverter circuit is known as linear load. The disadvantage with this approach is that it requires an additional voltage supply.

Another approach by the prior art is the use of a depletion mode IGFET with its gate and source electrically shorted to provide a load current characteristic with more current drive than the previously described load elements. An inverter circuit using this type of load has an enhancement mode IGFET with the same channel conductivity as the depletion mode load device to connect the output node to a source voltage supply. The gate of the enhancement mode device serves as input for the inverter circuit. Because of the gate-to-source short of the depletion mode device, its current output remains substantially constant as the output voltage transitions toward the drain voltage supply, thus enhancing the switching speed of the inverter circuit.

Another IGFET inverter circuit employed in the prior art uses a pair of complementary IGFET devices (CMOS) : an N-channel enhancement mode transistor connected to the least positive voltage supply and a P-channel enhancement mode transistor connected to the most positive voltage supply, with the common drains being the output. The gates of the transistors are connected together and receive the input signal. When the input signal is down, the N-channel enhancement mode device is turned off and the P-channel enhancement mode device is turned on so that the output is at the level of the most positive supply voltage. When the input signal is high, the N-channel device is on and the P-channel device is off and the output is at the level of least positive supply voltage.

Since one of the devices of the pair is always off during their steady state, this type of circuit is sometimes categorized as a dynamic type to suggest that it dissipates power only during its switching transients. This is in contrast with all the aforementioned circuits which dissipate power during both their transient and steady state and belong then to the static type of circuit.

A solution to the particular problem of providing IGFET chips with off chip driver circuits having sufficiently large output current to drive second level package capacitances, is to use bipolar transistor devices for the off chip driver in a hybrid IGFET bipolar chip. This solution has not been widely employed because of the higher costs associated with the extra processing needed for bipolar fabrication.

OBJECTS OF THE INVENTION

It is therefore an object of the invention to provide an IGFET inverter circuit having an improved load line characteristic.

It is still another object of the invention to provide an IGFET inverter circuit having a reduced delay time per stage of signal propagation.

It is yet another object of the invention to improve the cost/performance ratio of IGFET-bipolar hybrid LSI chips by using the extra processing steps needed for bipolar device fabrication to yield IGFET inverter circuits with improved performance.

SUMMARY OF THE INVENTION

These and other objects, features and advantages of the invention are accomplished by the IGFET inverter circuit with improved load line characteristics disclosed herein.

The disclosed IGFET static inverter circuit has an improved load line characteristic which is achieved by isolating the substrate of the load device of an enhancement/depletion mode IGFET inverter and electrically shorting the source of the IGFET to its isolated substrate. The static inverter circuit comprises an enhancement mode IGFET active device in a first portion of a semiconductor substrate, having its drain connected to an output node, its source connected to a first source potential and its gate connected to an input signal source. The first portion of the substrate is connected to a first substrate potential. A depletion mode IGFET load device is located in a second portion of the semiconductor substrate electrically isolated from the first portion, having its drain connected to a drain potential and its source and gate electrically shorted to the second portion of the substrate and connected to the output node of the inverter circuit. In this manner, as the output node voltage rises, the corresponding increase in the source-to-substrate bias of the load device is eliminated, providing an improved load characteristic for the inverter circuit.

Several alternate embodiments for the circuit are disclosed. Both the load device and the active device in the inverter circuit may be of the same channel type; either N-channel or alternatively P-channel. Alternatively, the inverter circuit may use a pair of complementary IGFET's with the enhancement mode IGFET active device being N-channel and the depletion mode IGFET load device being P-channel or vice versa. In addition, the electrical isolation between the first and second portions of the semiconductor substrate may be achieved by a single reverse biased PN junction or combined with dielectric isolation, or the use of an insulating substrate. Still another alternative for the inverter circuit contemplates isolating the enhancement mode IGFET active device in a small isolation region while the depletion mode IGFET load device occupies a portion of the main semiconductor substrate.

DESCRIPTION OF THE FIGURES

These and other objects, features and advantages of the invention will be more particularly appreciated with reference to the accompanying figures.

DISCUSSION OF THE PREFERRED EMBODIMENT

The preferred circuits disclosed herein comprise N-channel enhancement and depletion IGFET's. N-channel enhancement mode IGFET's are fabricated by diffusing spaced, N type source and drain regions into a P type substrate, forming an insulating layer such as silicon dioxide over the channel region between the source and drain regions, and then forming a conductive gate electrode over the channel region. Assuming that the source region of such a device is at ground potential, and that the drain region is biased to a positive voltage, the device will conduct whenever the gate-to-source voltage, $V_{GS}$, is more positive than the threshold voltage $V_T$ of the device, where $V_T$ is always designed to be a positive value. When the magnitude of $V_{GS}$ is less than $V_T$, no significant conduction will occur.

N-channel depletion mode IGFET's have the same configuration as above except for the presence of an N-channel between the diffused regions which is commonly fabricated by means of ion-implantation. A process for the implantation of N-channels to fabricate depletion devices is described in L. Forbes, "N-Channel Ion-Implanted Enhancement/Depletion FET Circuit and Fabrication Technology", *IEEE Journal of Solid State Circuits*, Vol. SC-8, June 1973, pp. 226-230. N-channel depletion mode devices have a threshold voltage which is always negative so that they conduct for zero and negative gate-to-source voltage.

It is to be understood that the present invention is equally applicable to P-channel transistors as it is to the disclosed N-channel transistor embodiment. The P-channel enhancement and depletion mode devices operate in the same way as the corresponding N-channel counterparts except that the polarity of the voltages is reversed. Accordingly, as disclosed herein, the term low voltage refers to the source voltage which is commonly fixed at ground potential and the term high voltage refers to the drain voltage which is a negative voltage for P-channel devices and a positive voltage for N-channel devices. Occasionally, it will also be convenient to refer to the drain voltage level as the logical one level, which for a P-channel device would typically range from −5 volts to −17 volts and for N-channel devices would typically be from +5 volts to +17 volts. Similarly, the source or ground voltage level will be occasionally referred to as the logical zero level; typically from 0 to 2.2 volts, positive for N-channel and negative for P-channel.

Figure 1A:
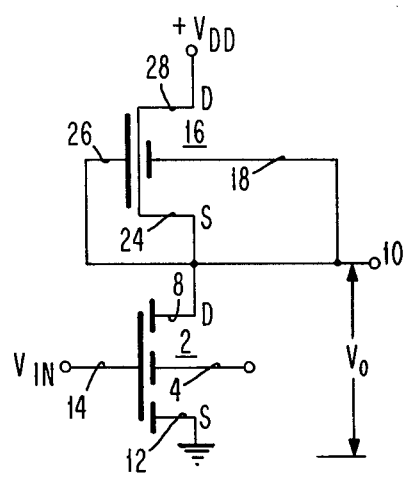
FIG. 1A is a schematic diagram of a first embodiment of the improved IGFET inverter circuit where both the load device and the active device are of the same channel type.
Figure 1B:
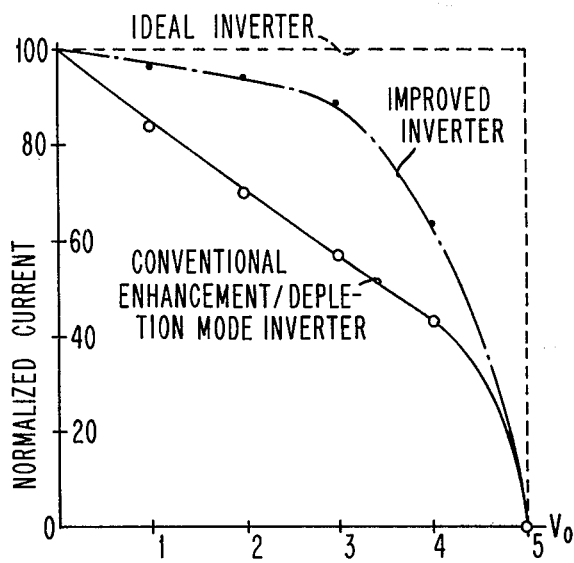
FIG. 1B illustrates the load current characteristic for the circuit of FIG. 1A.

The schematic diagram for the improved IGFET inverter circuit invention is shown in FIG. 1A and its load current characteristic is shown in FIG. 1B. For the purposes of comparison, the load current characteristic of an enhancement/depletion inverter and a theoretically ideal inverter are also shown in FIG. 1B. The inverter circuit which is schematically shown in FIG. 1A can be embodied by a structure shown in cross-section in FIG. 2. The IGFET static inverter circuit of FIG. 1A comprises an enhancement mode IGFET active device 2 in a first portion 4 of the P type semiconductor substrate 6. Enhancement mode IGFET device 2 has its drain 8 connected to an output node 10, its source 12 connected to a source potential, which in the case shown is ground, and its gate 14 connected to an input signal source $V_{IN}$. The first portion 4 of the substrate 6 is connected to a first substrate potential VSS. A depletion mode IGFET load device 16 is located in a second substrate region 18 which is electrically isolated from the first portion 4. A mode of electrical isolation for the depletion mode device 16 is a reversed biased PN junction 20 formed between the N type isolation diffusion 22 and the P type substrate 6. The depletion mode load device 16 has its source 24 and gate 26 connected together and electrically shorted to the isolated substrate 18 which is surrounded by the PN junction 20. The source 24, gate 26 and isolated substrate 18 are connected to the output 10 of the inverter circuit of FIG. 2. The drain electrode 28 is connected to a drain voltage supply $V_{DD}$. The drain voltage $V_{DD}$ may optionally be connected to the N type isolation diffusion 22 to sustain the reverse biased condition thereof with respect to the substrate 4 in which instance the drain electrode diffusion 28 and isolating diffusion 22 should be merged to reduce the area occupied by the load device.

For the improved inverter circuit of FIG. 1A, both the depletion mode IGFET device 16 and the enhancement mode IGFET device 2 have the same channel type, either P-channel or N-channel.

The circuit of FIG. 1A eliminates the rise in the source-to-substrate bias of the depletion mode load device 16 so as to provide an improved load characteristic for the inverter circuit, as is shown in FIG. 1B.

The reduction in current drive of the conventional enhancement/depletion inverter at high output voltage shown in FIG. 1B is caused by a corresponding rise in source-substrate bias combined with the simultaneous reduction of drain-source bias. In accordance with the invention, by eliminating the rise in the source substrate bias, the improved load characteristic of FIG. 1B obtains since the reduction of drain-source bias is then solely responsible for turning the device off.

Figure 2:
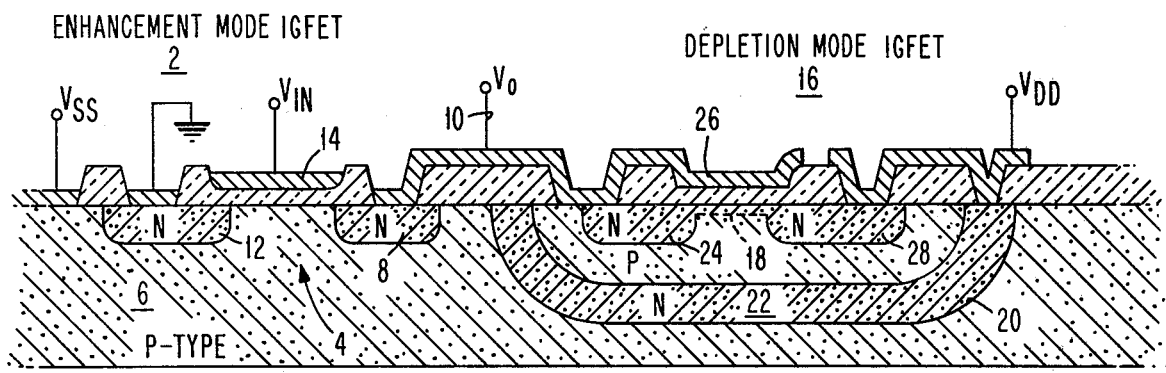
FIG. 2 is a cross-sectional structural diagram of the inverter circuit of FIG. 1A.

Shorting the source to the substrate of the depletion mode load device of FIG. 1A connot be done wtih conventional enhancement/depletion mode IGFET inverter structures where both the active device 2 and the load device 16 share the same substrate. Instead, it is necessary to isolate the substrate of the load device 16 from that of the active device 2. This is done as shown in FIG. 2, by using an isolating diffusion 22 tied to a reverse biasing voltage supply $V_{DD}$. FIG. 2 shows the arrangement for a P type substrate. On closer examination, it will be realized that this isolating structure 22 can also be used as an NPN bipolar transistor. Consequently, the cost/performance ratio of a hybrid IGFET bipolar technology can be lowered by introducing enhancement/depletion mode inverters with the improved load characteristics of FIG. 1B and practically the same additional processing required by the prior art used to integrate bipolar and IGFET transistors.

Delays for the circuit configuration of FIG. 1A and the conventional enhancement depletion mode type were compared at a power dissipation level of 0.25 milliwatts. The proposed circuit comprised an active device having a source-drain spacing of 3.9 micron and a gate width of 4.6 micron. The corresponding parameters fo the load device were 7.11 and 3.5 micron. The load device had a gate-drain overlap capacitance of 0.007 pF, an output capacitance of 0.20 pF and an isolation capacitance of 0.030 pFd. An inverter delay of 10.5 nanoseconds was obtained from the transient solution generated by a computer analysis program. The conventional inverter had an active device of the same size and a load device whose length was decreased to 3.76 micron in order to match the power of both circuits. Its computed delay was 12.0 nanoseconds.

The improvement discussed in the last paragraph applies to nominal designs; that is, with device parameters a their nominal values. However, because of process variations, device parameters have a distribution of values which in turn cause a distribution for the circuit delays. Thus, the worst case delay out of this distribution dominates the performance of plurality of circuits integrated in a semiconductor chip. It is then possible to improve the nominal circuit delay and yet obtain no practical improvement because the distribution for the delays has not been improved. The proposed circuit not only improves nominal delays but also narrows their distribution. This is because by having the source of the load device shorted to the substrate, the effect of substrate doping variations on the threshold voltage is reduced. This is in contrast with conventional enhancement depletion mode inverters whose source-substrate bias can be as high as the voltage drop between the drain and substrate supplies during the off transition. The beneficial effect of the source-substrate short on the current distribution of the load device has been simulated using Monte-Carlo techniques. The simulated distribution has a sigma equal to 16 percent of the nominal current. The same analysis for the conventional load characteristics at its minimum source-substrate bias yields a sigma of 25 percent of the nominal current.

Typical prior art CMOS technology interconnects complementary IGFET pairs to operate in a dynamic mode by having their source regions shorted to their respective substrates, their drains shorted together to the output node and their gates shorted together as the input node. As the input signal voltage drops from the most positive voltage supply, $V_{DD}$ to ground, the gate-to-source bias of the load device increases while its drain-to-source bias decreases from $V_{DD}$ to ground. Thus, during most of the swing, the prior art load device operates within its linear range and its characteristic resembles a linear load.

Figure 3A:
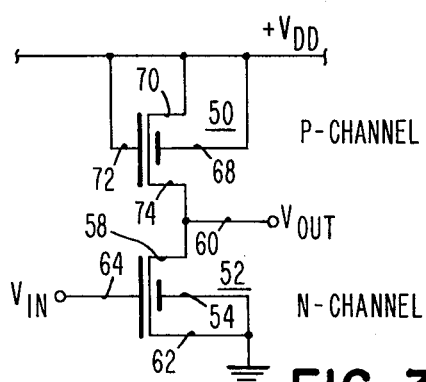
FIG. 3A is a schematic diagram of the improved complementary IGFET inverter circuit.
Figure 3B:
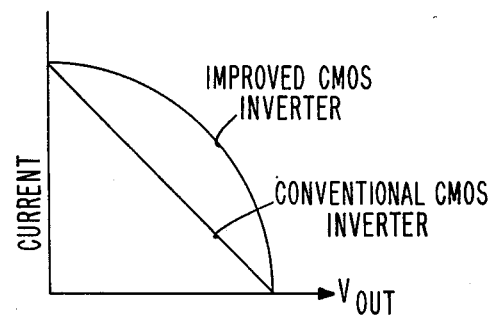
FIG. 3B illustrates the load current characteristics for the prior art complementary inverter circuit and the improved complementary IGFET inverter of FIG. 3A.

An improved load characteristic can be obtained by interconnecting the complementary IGFET pairs to operate in a static mode as shown in FIG. 3A. The improved load characteristic is shown in FIG. 3B. This is obtained by taking advantage of the isolation between N-channel and P-channel devices and using a P-channel depletion device with the usual gate-to-source short as shown in FIG. 3A. Thus, essentially, this inverter circuit is that of FIG. 1A with a P-channel device for load element. To implement this circuit starting from a given CMOS process only one extra fabrication step is required. This is the shift of the originally negative $V_T$ of the P-channel device 50 to a positive value by means of an extra masking step and a boron implant.

The complementary IGFET static iverter circuit of FIG. 3A has an N-channel enhancement mode IGFET active device 52 in the first portion 54 of a semiconductor substrate 56. The N-channel IGFET active device 52 has its drain electrode 58 connected to an output node 60, its source 62 connected to a first source potential which is grounded in the case shown in FIG. 3A, and its gate 64 connected to an input signal source, $V_{IN}$. The first portion 54 of the substrate 56 is connected to a first substrate potential. In the embodiment shown in FIG. 3A, the first substrate potential is connected to ground and is common with the first source potential.

A depletion mode P-channel IGFET load device 50 is formed in a second portion 68 of the semiconductor substrate 56, which is electrically isolated from the first portion 54. The P-channel depletion mode IGFET load device 50 has its source electrode 70, its gate electrode 72 and the second portion of the semiconductor substrate 68 all shorted to a second souce potential $V_{DD}$. The drain electrode 74 is connected to the output node 60.

Thus, by having the gate, source and substrate of the depletion device shorted to a fixed voltage supply, the improved load characteristic of FIG. 3B is obtained since as the output voltage rises only the drop of drain-source bias reduces the load current.

In an alternate embodiment, the channel types for devices 50 and 52 can be reversed as was discussed above, with the device 50 being an N-channel depletion mode IGFET and the device 52 being a P-channel enhancement mode IGFET.

Figure 4A:
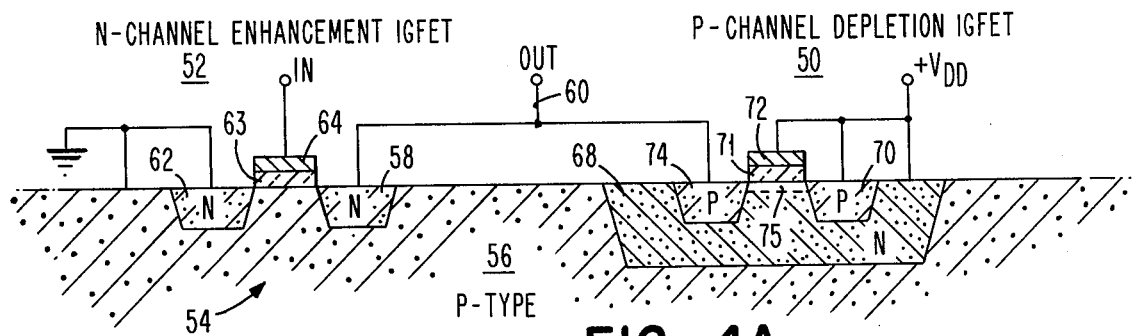
FIG. 4A illustrates a complementary transistor embodiment for the improved inverter circuit.
Figure 4B:
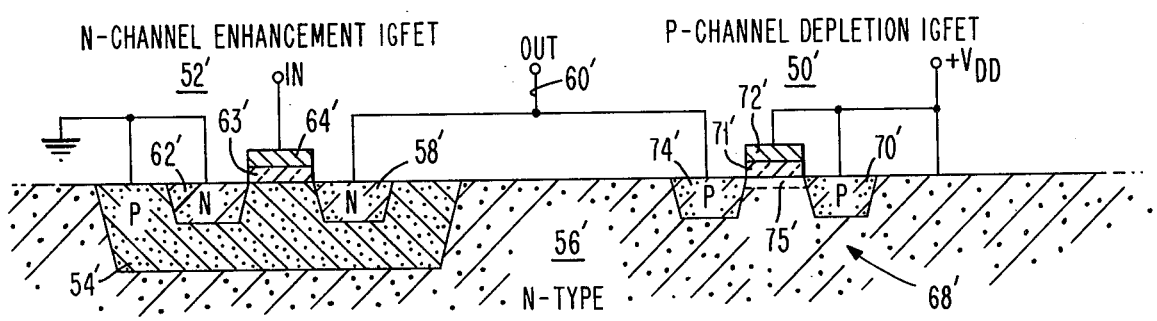
FIG. 4B illustrates an alternate complementary transistor embodiment for the improved inverter invention.

The electrical isolation between the first portion 54 and the second portion 68 of the substrate 56 can be accomplished in two ways as is shown in FIGS. 4A and 4B. In FIG. 4A, the substrate 56 is P type conductivity and an N type well 68 is diffused into the substrate 56 which serves as the second portion of the substrate referred in FIG. 3A above. The source 70, gate 72 and N type second portion of the substrate 68 are all connected to the positive potential $V_{DD}$. The ground connection to the first portion 54 of the substrate 56 assures that the PN junction formed between the second portion 68 and the substrate 56 will be reverse biased, thereby electrically isolating the P-channel depletion mode load device 50 with implanted depletion region 75, from the N-channel enhancement mode active device 52.

Alternatively, FIG. 4B shows the use of an N type conductivity substrate 56' wherein a P type well 54 has been diffused to serve as the first portion 54' of the substrate 56', referred to above. The connection of the positive $V_{DD}$ voltage to the region 68' of the substrate 56' and the connection of the P type well 54' to ground potential assures the reverse bias condition of the PN junction formed at the interface of the first region of the substrate 54' and the substrate 56', and thereby electrical isolation between the devices 50' and 52'.

Alternate methods for electrically isolating the devices 50 and 52 can include the silicon on sapphire approach of the prior art or employing a dielectric isolation region surrounding each respective device.

This implementation of the proposed static complementary circuit extends upward the frequency range where the CMOS technology has a better power-delay product than the static inverters reviewed in the background section. It is well known that the power-delay product of dynamic CMOS inverters degrade with increasing switching frequency. A precise analysis of this problem has been published by P. W. Cook, D. L. Critchlow and L. M. Terman in "Comparison of MOSFET Logic Circuits," *IEEE Solid State Circuits Journal*, Vol. SC-8, October 1973, pp. 348–355. The authors introduce the concept of the switching factor, S, to compare the performance of linear load, enhancement/ depletion mode and CMOS inverter circuits. The figure of merit S is given by the product of the average frequency of transition and circuit delay. They show that for S larger than 0.25, dynamic CMOS inverters have a larger power-delay product than the competing static circuits. This superiority in performance of the aforementioned static inverters operating at high S also applies to the circuit of FIG. 1A since it has a better load characteristic than the conventional enhancement/depletion inverter. It follows that a given CMOS technology can be made to satisfy circuit applications with S larger than 0.25 by implementing the additional processing steps described above to fabricate the static CMOS inverter circuit of FIG. 3A.

The fabrication process for the high performance enhancement/depletion mode inverter circuit of FIG. 1A will be described in what follows. The process provides for the simultaneous formation of the IGFET circuit and bipolar transistors.

Figure 5A:
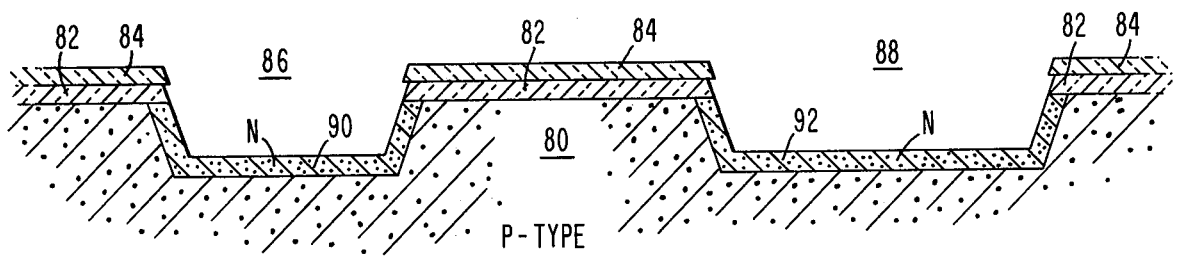
FIGS. 5A through 5E illustrate cross-sectional views of the structure of the inverter circuit of FIG. 1A during a sequence of processing steps used for its fabrication.

First, start with a [100] oriented P type substrate 80 as shown in FIG. 5A. Grow about 1000A of thermal silicon dioxide 82 and follow with the deposition of 1000A of silicon nitride 84. During a second step, mask 1 is used to open windows 86 and 88 defining the areas for the location of the depletion mode IGFET device 106 and the bipolar transistor device 107. After etching the silicon nitride 84 and the silicon dioxide layer 82, a hydrazine-water solution is used to anisotropically etch flat bottom wells 86 and 88 having a depth of between five and six microns.

The third step consists of depositing and driving in phosphorous or arsenic to form N type junctions isolating regions 90 and 92 completely surrounding the wells 86 and 88, respectively, which were etched during step 2. Region 90 also serves as the collector region for bipolar transistor 107 to be formed within well 86. FIG. 5A shows a cross-sectional view of the structure at this stage of the process.

Figure 5B:
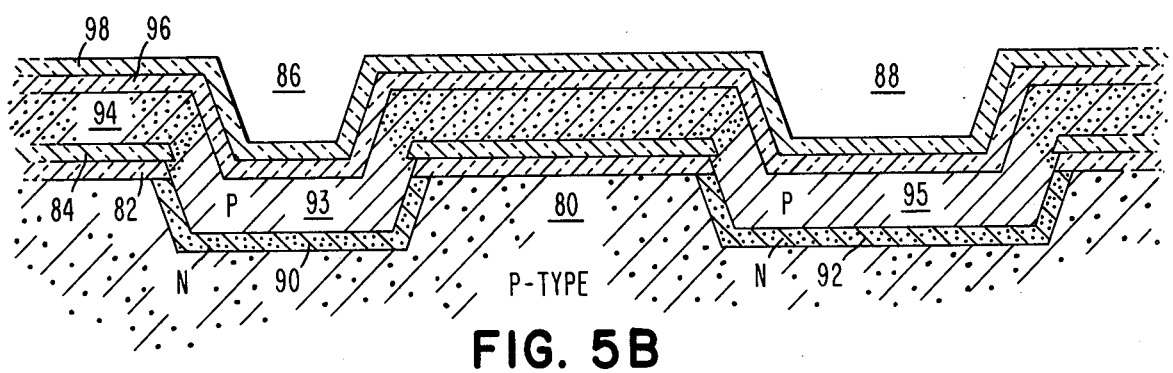

The fourth step starts with the etching of any glass layer grown during the preceding phosphorous diffusion of step 3 and then depositing a P type epitaxial layer 94 on the surface of the structure of FIG. 5A, of such thickness to make the refilled wells 93 and 95 coplanar with the original substrate surface as shown in FIG. 5B. The epitaxial layer 94 turns into polycrystalline silicon over the field regions where the oriented single crystalline substrate 80 is not exposed but is protected by the composite of dielectric layers 82 and 84. The resistivity of the layer 94 is primarily determined by threshold voltage considerations. Next, a growth of about 1000A of thermal silicon dioxide layer 96 is carried out on top of the silicon layer 94 which is followed with the deposition of 1000A of silicon nitride layer 98.

Figure 5C:
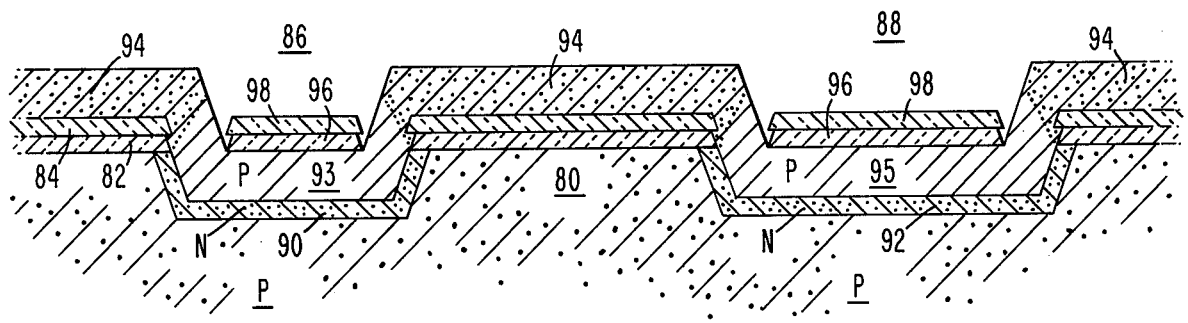

The fifth step of the process calls fo the use of a second mask to define an area within the bounds of P wells 86 and 88. By plasma etching the silicon nitride layer 98 and silicon dioxide layer 96 outside this area, a frame is defined between the remaining nitride and oxide on top of the P refilled wells 93 and 95 and the edges of the window defined in step #2. FIG. 5C shows a cross-sectional view of the structure at this stage of the process.

The sixth step involves using again an anisotropic etch to remove the polycrystalline silicon layer 94 lying on top of the field regions and to etch isolation moats 100 and 102 in the frames defined in step #5. Unlike step #2, the self-stopping property of the anisotropic etch is used here to produce V shaped holes whose depth depends on the width of the window. For instance, to get a two micron deep hole, the frame should be 2.8 microns wide. Except for the initial diffusion cycle of step #3, this technique of etching and refilling using an anisotropic etchant and epitaxial deposition has been practiced successfully and reported in M. J. DeClercq, "A New CMOS Technology using Anisotropic Etching of Silicon", *IEEE Journal of Solid State Circuits*, Vol. SC-10, August 1975, pp. 191–197.

Figure 5D:
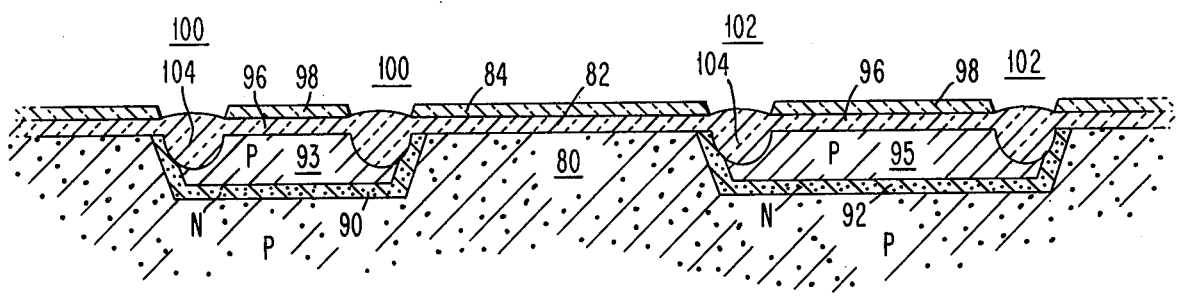

The seventh step of the process consists of growing thermal silicon dioxide layers 104 to fill the isolating moats 100 and 102 in FIG. 5D. Since about 40 percent of this oxide growth is directed into the silicon surface, a portion of the isolating diffusions 90 and 92 adjacent to the moats are converted into silicon dioxide. This loss is partially compensated by the resulting deeper junction and phosphorous accumulation at the oxide interface.

FIG. 5D shows the resulting cross-sectional view with P pockets 93 and 95 respectively isolated from the starting substrate 80 by a combination of PN junctions 90 and 92 and dielectricfilled moats 100 and 102.

At this point the structure is ready to undergo any of several available IGFET processes, such as silicon gate of metal gate technology. For the sake of simplicity, a metal gate process has been used for the remaining steps.

Step eight consists of dip etching in warm phosphoric acid to remove the silicon nitride layers 84 and 98.

Step nine consists of growing a field silicon dioxide layer 108 to a thickness of 2000A and then using a third mask and appropriate etching to open a window to diffuse there through emitter 110 of the bipolar device 107 to a depth of about 1.5 microns. The subsequent heat cycle for the source and drain regions will drive the emitter to a depth of 2.5 microns.

Step ten employs a fourth mask and appropriate etching to open windows for the subsequent diffusion of the source regions 112 and 116 and drain regions 114 and 118 to a depth between 1.5 and 2 micron. Simultaneously with this drive-in, the field oxide layer 108 is thickened to 6000A. Since the isolating diffusion 92 is to be connected to the drain voltage supply, it is necessary to keep the distance between this diffusion and the bottom of the source 116 larger than the length at which electrical punch-through occurs. For a given substrate doping, this length is somewhat less than the minimum allowable source-drain spacing. contrariwise, the emitter diffusion 110 of step #9 must be about 1 micron away from the collector 90. Thus, large punch-through voltage and narrow basewidth become conflicting requirements when the minimum allowable sourcedrain spacing is larger than about 1.5 micron and it is then necessary to use the separate masking and etching operations in steps 9 and 10 to obtain the desired vertical doping profile for both devices.

Step eleven consists of using a fifth mask to define the gates 120 and 122 and contact windows 124, 126, 128, 130, 132, 134, 136 and 138. Contact window 124 for the source 116 of the load device 106 overlaps the P type pocket 95 to establish the required electrical short between source and substrate.

Step twelve consists of growing thermal silicon dioxide layers 128 and 130 for the gate dielectric to a thickness of about 700A.

Step thirteen consists of using a sixth mask to define a window for implantation of the N-channel 97 of the load device 106. The implantation of a phosphorous dosage of $1.7 \times 10^{12}$ ion/cm$_2$ at 70 Kev to set the threshold voltage at about $-2$ volts will insure an appropriate depletion mode load device 106.

Figure 5E:
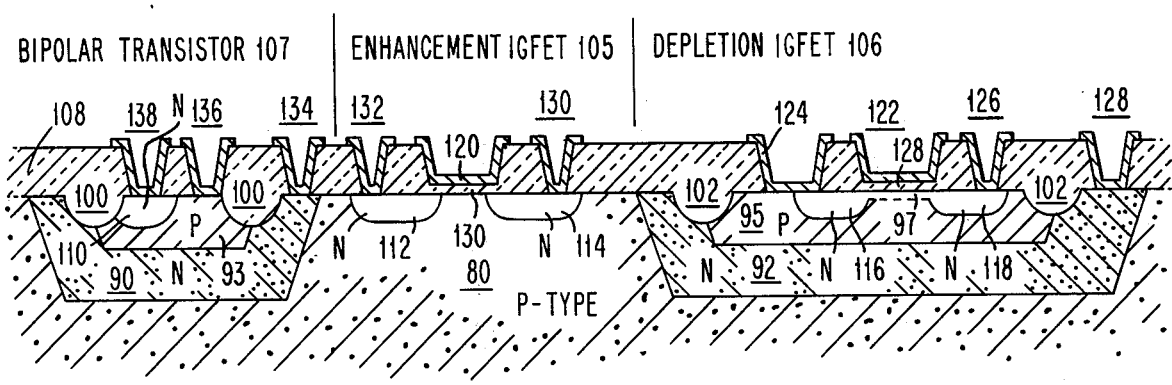

Step fourteen consists of using two additional masks and associated etching solutions for opening contacts and defining metal gate shapes and interconnection patterns. A cross-sectional view of the final structure is shown in FIG. 5E.

An enhancement/depletion mode circuit configuration with improved current driving capabilities has been described. It can be implemented using processes suitable for an IGFET-bipolar hybrid technology or CMOS. The process given here is designed to minimize the capacitance of the isolation region and reduce the total number of masks. The main features of the disclosed circuit and process are as follows. (1) An increase as large as 60 percent for the load current relative to that for the conventional enhancement/depletion circuits. (2) Delay per stage is reduced by 10 percent. (3) A narrow spread for the current distribution of the load device which in turn narrows the spread of the delay distribution. (4) It extends upward the advantageous frequency range of CMOS technology. (5) The availability of bipolar devices which can be used for off-chip drivers, linear circuits or buffer stages between IGFET chips and other types of technologies. (6) The doping of the substrate of the load device can be chosen independently of that of the active device to meet specific performance goals. (7) For the process described here, only one extra mask is required relative to an IGFET-bipolar technology based on triple diffused transistors. (8) In addition to the process give here, other IGFET processes can be adapted to fabricate the proposed enhancement/depletion circuit configuration.

While the invention has been particularly shown and described with reference to the preferred embodiments thereof, it will be understood by those skilled in the art that the foregoing and other changes in form and details may be made therein without departing from the spirit and scope of the invention.

We claim:

1. An IGFET static inverter having an improved load current characteristic, comprising:
   an enhancement mode IGFET active device in a main portion of a semiconductor substrate, having its drain connected to an output node, its source connected to a source potential and its gate connected to an input signal source;
   said main portion of said substrate connected to a first substrate potential;
   a depletion mode IGFET load device in a portion of said semiconductor substrate electrically isolated from said main portion, having its drain connected to a drain potential, its source and gate connected to said output node, and said isolated substrate connected to said output node;
   whereby the rise in source-to-substrate bias during the turn off transition is eliminated in said depletion mode load device, providing an improved load characteristic for the inverter circuit.

2. The inverter of claim 1, wherein said electrically isolated region is isolated by means of a PN junction surrounding said isolated region, which is maintained in a reverse biased state by electrically connecting the N side of said junction to a second potential higher than said first potential.

3. The inverter of claim 2, wherein said second potential is said drain potential.

4. The inverter of claim 1, wherein said electrically isolated region is isolated from said main substrate by a dielectric isolation region surrounding said electrically isolated region.

5. The inverter of claim 1, wherein said active and load IGFET devices are both P-channel types.

6. The inverter of claim 1, wherein said active and load IGFET devices are both N-channel types.

* * * * *